United States Patent
Alcocer Ochoa et al.

(10) Patent No.: US 9,100,047 B2
(45) Date of Patent: Aug. 4, 2015

(54) METHOD AND APPARATUS FOR MITIGATING RESONANT EFFECTS WITHIN A POWER DELIVERY NETWORK OF A PRINTED CIRCUIT BOARD

(71) Applicant: Intel Corporation, Santa Clara, CA (US)

(72) Inventors: Alberto Alcocer Ochoa, Zapopan (MX); Jose A. Sanchez Sanchez, Tlaquepaque (MX); Dawson W. Kesling, Davis, CA (US); Maynard C. Falconer, Portland, OR (US); Antonio Zenteno Ramirez, Guadalajara (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/032,968

(22) Filed: Sep. 20, 2013

(65) Prior Publication Data

US 2015/0089315 A1    Mar. 26, 2015

(51) Int. Cl.
| | |
|---|---|
| *H04L 1/00* | (2006.01) |
| *G06F 11/00* | (2006.01) |
| *H03M 13/03* | (2006.01) |
| *H04L 25/02* | (2006.01) |
| *H04L 25/49* | (2006.01) |

(52) U.S. Cl.
CPC ............. *H03M 13/03* (2013.01); *H04L 25/022* (2013.01); *H04L 25/4906* (2013.01)

(58) Field of Classification Search
None
See application file for complete search history.

(56) References Cited

U.S. PATENT DOCUMENTS

| | | | |
|---|---|---|---|
| 6,456,666 B1 * | 9/2002 | Gabara et al. .................. | 375/259 |
| 2002/0138805 A1 * | 9/2002 | Hall et al. ...................... | 714/759 |
| 2004/0002860 A1 * | 1/2004 | Deisher et al. ................ | 704/233 |
| 2007/0177729 A1 * | 8/2007 | Reznik et al. .................... | 380/44 |
| 2014/0056337 A1 * | 2/2014 | Kesling et al. ................ | 375/219 |
| 2014/0146969 A1 * | 5/2014 | Sadot et al. ................... | 380/256 |

* cited by examiner

*Primary Examiner* — Daniel McMahon
(74) *Attorney, Agent, or Firm* — International IP Law Group, P.L.L.C.

(57) ABSTRACT

A method for reducing noise on a power distribution network of a printed circuit board includes determining whether a given data signal may be a problematic data signal. The given data signal is issued onto a signal distribution network of the printed circuit board if the given data signal is determined to not be a problematic data signal. The given data signal is encoded into an encoded data signal if the given data signal is determined to be a problematic data signal, and the encoded data signal is issued onto the signal distribution network.

19 Claims, 8 Drawing Sheets

800

200

400

500

700

METHOD AND APPARATUS FOR MITIGATING RESONANT EFFECTS WITHIN A POWER DELIVERY NETWORK OF A PRINTED CIRCUIT BOARD

TECHNICAL FIELD

The present techniques relate generally to printed circuit board power delivery networks (PDNs). More particularly, the present techniques relate to mitigating the adverse resonant-frequency effects that occur in such PDNs.

BACKGROUND ART

The objective of a printed circuit board (PCB) power delivery network (PDN) is to provide a stable supply voltage to the integrated circuits on the PCB. The objective of a PCB signal distribution network (SDN) or data bus is to distribute signals, which are often very high frequency switching signals, among and between the integrated circuits on the PCB. The high frequency switching signals and the current drawn by the switching devices producing those switching signals may induce noise onto the supply voltage carried by the PDN as well as devices on the PCB, such as, for example, sensors. The continuing trends of increasing IC clock and switching speeds induce higher levels of noise on the PDN, and the trend toward reduced IC supply and Input-Output (IO) voltages to increase battery life of mobile devices cause the level of noise that can be tolerated on the supply voltage to shrink. In other words, as supply voltages shrink and as clock/switching speeds increase, IC devices have reduced tolerance for noise on the supply voltage provided by the PDN.

Since the amount of noise that may be induced onto the PDN by the switching signals on the SDN is proportional to the impedance of the PDN, the worst case induced noise levels occur when the switching signals have considerable power content in a frequency that approximates the one or more resonant frequencies of the PDN, since impedance of the PDN peaks at those one or more resonant frequencies. PDN noise may also be problematic at other frequencies at which the PDN has relatively high impedance values. Decoupling capacitors may be added to reduce the degree of coupling between the PDN and the SDN over one or more target frequency bands, requiring the use of a range of values of decoupling capacitors, or the size of the power plane area may be increased, but these approaches undesirably increase the cost and form factor of the PCB.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
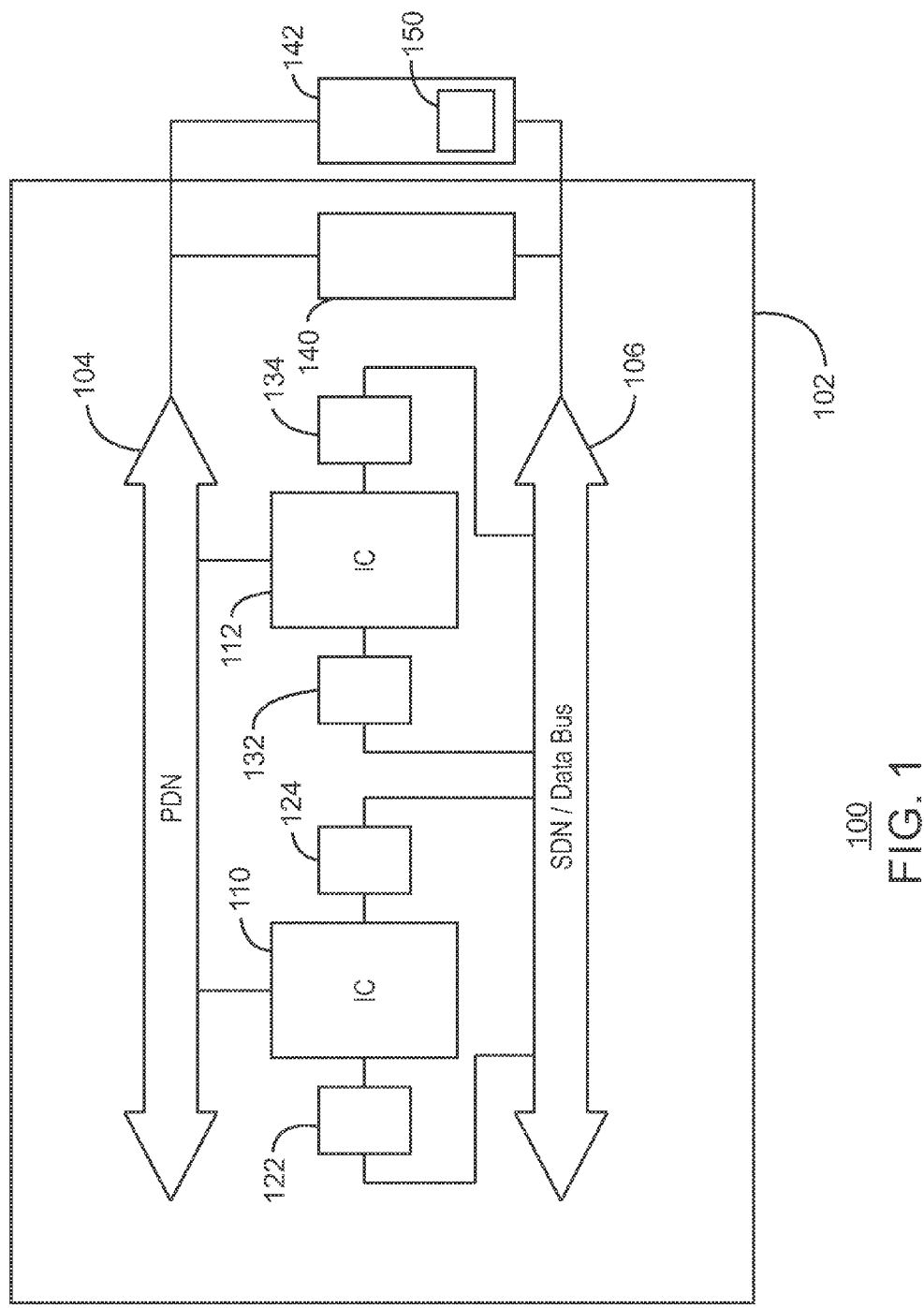
FIG. 1 is a block diagram of an electronic device, in accordance with embodiments.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 is a block diagram of an electronic device 100 having mitigated resonant-frequency effects within a power delivery and power management network. Electronic device 100 may be virtually any type of electronic device that includes one or more circuit boards with power delivery and signal delivery networks and one or more ICs coupled to those networks, such as, for example and without limitation, a computer, laptop, tablet, smart phone, television, audio or video recorder, etc. Electronic device 100 includes circuit board 102 having a power delivery network (PDN) 104 and a signal distribution network (SDN) 106. ICs 110 and 112 receive supply voltage and current from PDN 104, and transfer data or other fast-switching signals to and from each other and other components of electronic device 100 via SDN 106. More particularly, IC 110 receives input signals, such as data or other fast-switching signals, from SDN 106 via element 122 and transfers output signals, such as data or fast-switching signals, to SDN 106 via element 124. Similarly, IC 112 receives input signals, such as data or fast-switching signals, from SDN 106 via element 132 and transfers output signals, such as data or fast-switching signals, to SDN 106 via element 134. Collectively, these signals may be referred to as I/O signals.

It should be particularly noted that, in embodiments, elements 122, 124, 132, and 134 may be separate from ICs 110 and 112, respectively, while in other embodiments one or more of elements 122, 124, 132, and 134 may be integral with ICs 110 and 112. It should also be particularly noted that ICs 110 and 112 may be virtually any type of integrated circuits, such as, for example and without limitation, memory chips, transistors, graphics processing chips, microprocessors, digital signal processors, interface ICs, etc.

Electronic device 100 may also include CPU 140, for example, a microprocessor, and memory device 142, each of which may be provided with supply/operating voltage and current via PDN 104 and receive and send signals via SDN 106. CPU 140 may be a conventional CPU capable of reading and executing instructions, including instructions 150 stored in memory device 142. Memory device 142 may be configured as random access memory, read only memory, flash memory, EEPROM, removable memory such as an SD card or USB memory stick, or any combination of the foregoing. Memory device 142 includes a non-transitory medium that stores computer-readable instructions 150 that are executable by CPU 140, and which will be more particularly described hereinafter.

It should also be particularly noted that, in embodiments, CPU 140, memory device 142, and other devices associated with circuit board 102 may also include or be interconnected to the SDN via elements corresponding to elements 122, 124, 132, and 134.

Figure 2:
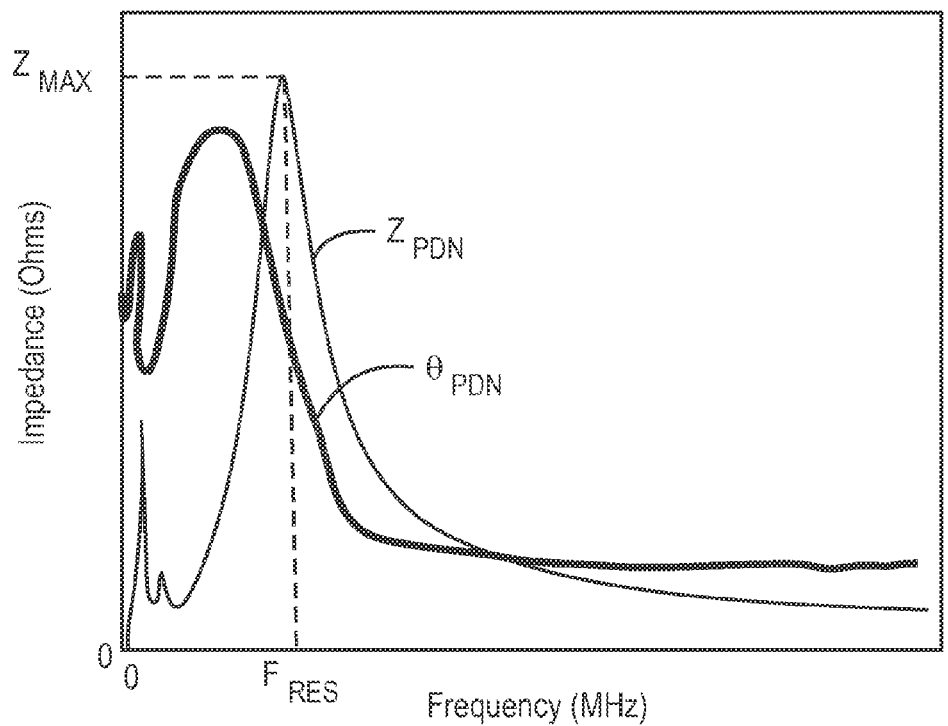
FIG. 2 is a plot of a normalized impedance characteristic of an exemplary power delivery network plotted against frequency.

PDN 104 has an inherent impedance characteristic or profile. FIG. 2 shows an exemplary normalized impedance amplitude profile $Z_{PDN}$ of PDN 104 that includes a peak amplitude impedance value $Z_{MAX}$ at a PDN 104 resonant frequency $f_{RES}$. Typical I/O signals are transferred at frequencies that are much higher than the typical resonant frequency of a PDN, and exhibit nearly-random data spectrum. However, one or more bit patterns may have a significant power spectral density (PSD) at or near the PDN 104 resonant frequency $f_{RES}$. Signals having a significant PSD at or near the PDN 104 resonant frequency $f_{RES}$ are likely to result in a significant degree of coupling between the PDN 104 and the SDN 106, thereby creating a relatively-high level of induced noise on the PDN 104, and as such may be referred to herein as problematic data or bit pattern signals.

As generally discussed above, ICs 110 and 112 receive signals from SDN 106 via elements 122 and 132, respectively, and transfer signals to SDN 106 via elements 124 and 134, respectively. Prior to issuing a problematic data or bit pattern signal onto the SDN 106, elements 124 and 134, in embodiments, may alter the data or bit pattern of the problematic signal to, in embodiments, reduce the PSD of the signal to be issued onto the SDN 106 at the one or more frequencies at which the PDN 104 has a relatively high level of impedance, including PDN 104 resonant frequency $f_{RES}$. Thus, a substitute bit pattern or data signal having a reduced PSD at resonant frequency $f_{RES}$ is issued by elements 124 and 134 onto SDN 106 thereby significantly reducing the degree of coupling between the PDN 104 and SDN 106 and reducing the induced noise on PDN 104.

The inherent impedance profile of PDN 104 also has a phase angle $\theta_{PDN}$ that varies with frequency, as shown in FIG. 2. The exemplary normalized impedance profile of PDN 104 shows phase angle $\theta_{PDN}$ having a maximum phase angle $\theta_{MAX}$ at frequency $f_{ZMAX}$. Bit or data pattern signals that have a high phase angle at or near frequency $f_{ZMAX}$ may also increase the degree of coupling between PDN 104 and SDN 106, and are therefore also referred to hereinafter as problematic signals. Prior to issuing a problematic bit pattern or data signal onto SDN 106, elements 124 and 134 may alter the bit pattern or data signal to thereby alter, and in embodiments reduce or minimize, the phase angle of the substitute signal to be issued onto the SDN 106 at the one or more frequencies at which the impedance characteristic of the PDN 104 has a relatively high phase angle, including frequency $f_{ZMAX}$. Thus, a substitute bit pattern or signal having a reduced or minimum phase angle at frequency $f_{ZMAX}$ may be issued by elements 124 and 134 onto SDN 106 thereby significantly reducing the degree of coupling between the PDN 104 and SDN 106 and reducing the induced noise on PDN 104.

Elements 122 and 132 receive the reduced-PSD substitute signal from SDN 106, and interpret or decode the reduced-PSD signal to thereby render the substitute data pattern or signal intelligible to and compatible for processing by ICs 110 and 112, and to communicate the same data/information as the original problematic signal.

Figure 3:
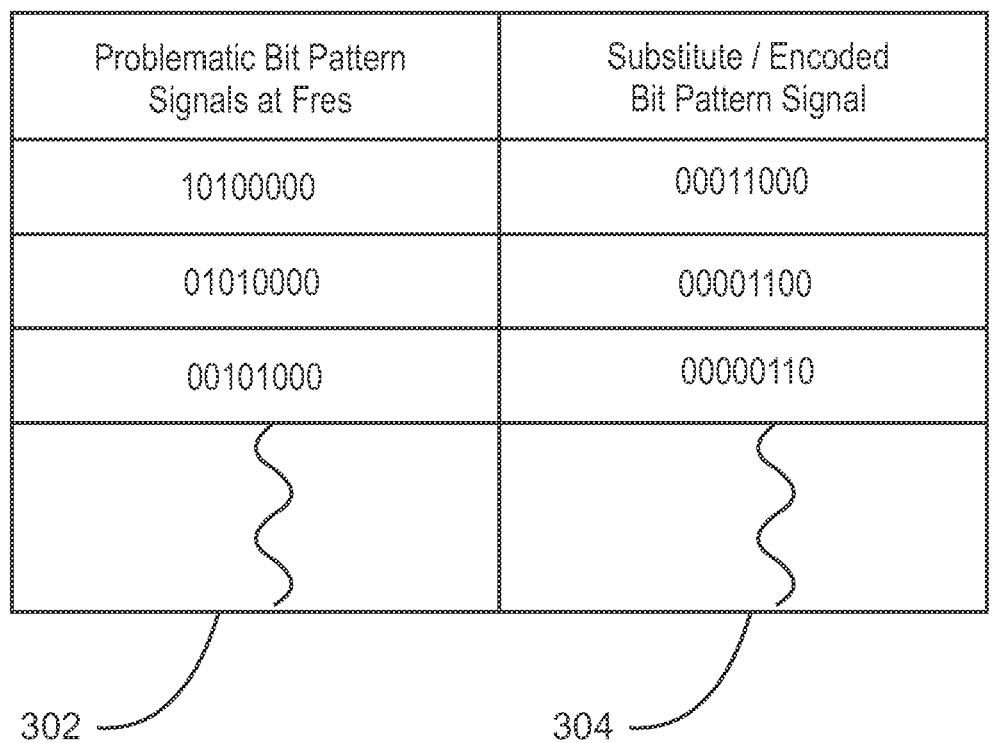
FIG. 3 is an exemplary look up table.

In embodiments, elements 124 and 134 may alter the problematic data or bit patterns by utilizing a look up table. An exemplary look up table 300 is shown in FIG. 3, which lists in the left column 302 data or bit pattern signals that may be problematic at or near $f_{RES}$ and exemplary corresponding substitute/encoded data or bit pattern signals in the right column 304 that have reduced or minimal energy at or near $f_{RES}$ relative to the bit pattern signals of left column 302. The look up table 300 may be derived by identifying a plurality of problematic data or bit patterns and identifying data or bit patterns having reduced or minimal energy at or near $f_{RES}$ that may be substituted for the original problematic data or bit pattern, i.e., one having a PSD energy that exceeds a certain maximum threshold at or near $f_{RES}$. The elements 124 and 134 may access directly the look up table, locate the problematic data or bit pattern in column 302, and read the substitute or encoded data or bit pattern from column 304. The substitute or altered data or bit pattern may then be issued by elements 124 and 134 onto SDN 106 as a substitute signal for the original problematic data or bit pattern signal. The substitute or altered data or bit pattern is then decoded or interpreted by elements 122 and 132 accessing a reverse look up table that lists the original problematic data or bit pattern corresponding to each substitute or altered data or bit pattern.

In embodiments, a fourier transform may be utilized to estimate the frequency spectrum or PSD of data patterns to thereby identify problematic bit or data patterns having an energy level that exceeds a predetermined threshold at or near $f_{RES}$ and to identify substitute bit or data patterns having reduced or minimal energy at or near $f_{RES}$. More particularly, each bit or data pattern has an inherent voltage and current characteristic or waveform. A fourier transform of the current or voltage characteristic may be performed to predict the PSD of the bit or data pattern.

In embodiments, altering of the data or bit patterns may include elements 124 and 134 utilizing or accessing a look up table that identifies substitute data or bit patterns having reduced or minimized phase angle at or near $f_{RES}$. In still other embodiments, altering the data or bit patterns may include elements 124 and 134 similarly utilizing or accessing a look up table that identifies substitute data or bit patterns having both a reduced or minimal energy at or near $f_{RES}$ and having a reduced or minimal phase angle at or near frequency $f_{ZMAX}$. It should also be noted that the data or bit patterns may, in embodiments, be altered by elements 124 and 134 similarly utilizing or accessing a look up table that identifies substitute data or bit patterns that add one or more additional data bits to the problematic bit or data pattern to form a substitute signal having a reduced or minimal energy at or near $f_{RES}$ and/or a reduced or minimal phase angle at or near frequency $f_{ZMAX}$.

It should be noted that, in embodiments, elements 124 and 134 utilize or access a look up table to determine substitute data or bit patterns that are altered or encoded versions of the problematic data or bit patterns. It should be further noted that other forms of encoding/decoding may be utilized within the scope of the present invention, including, for example and without limitation, utilizing state machines or other now known or later discovered methods of encoding and decoding.

Figure 4:
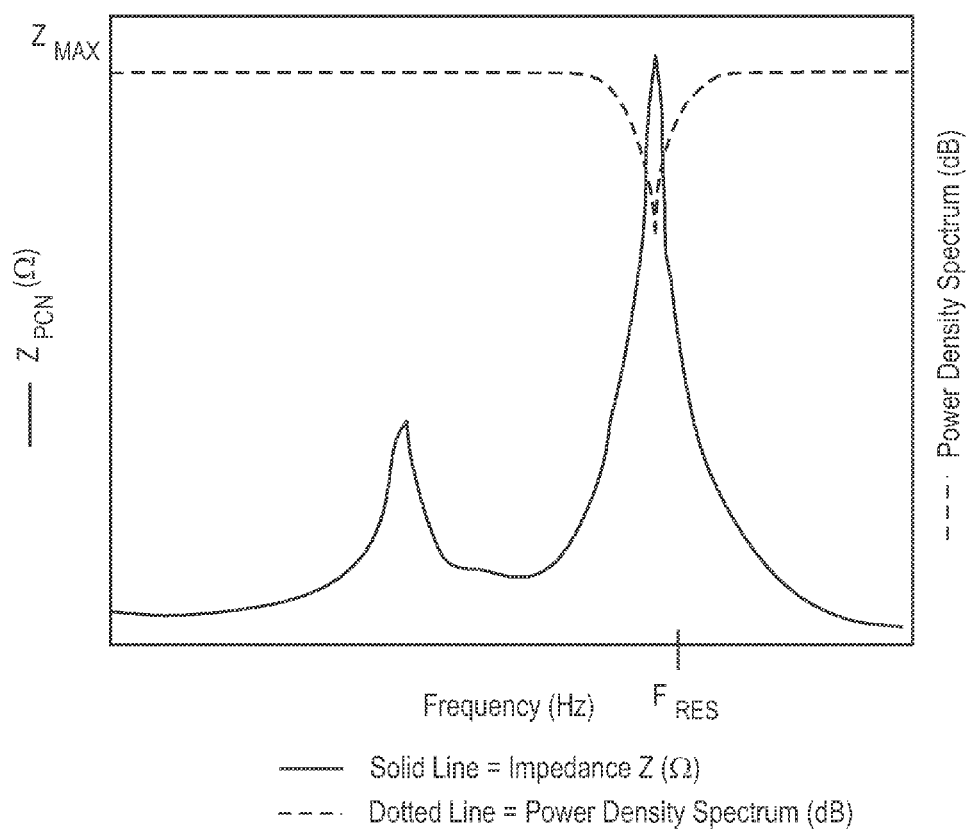
FIG. 4 is a plot of a normalized impedance characteristic of an exemplary power delivery network and a normalized power spectral density characteristic of an exemplary encoded data or bit pattern plotted against frequency.

FIG. 4 graphically illustrates the benefit that may be obtained by substituting a data or bit pattern signal having a PSD characteristic with reduced energy at or near $f_{RES}$. The PSD of an exemplary substitute or encoded data or bit pattern is shown by the dashed line $PSD_{SUB}$ plotted on the same set of axes as normalized impedance characteristic $Z_{PDN}$. As shown in FIG. 4, the PSD characteristic of the encoded or substitute data or bit pattern $PSD_{SUB}$ sharply decreases in a frequency band encompassing, in embodiments above and below, $f_{RES}$. Thus, the degree of coupling between PDN 104 and SDN 106, and therefore the level of induced noise on PDN 104, are significantly reduced by the encoded or substitute data or bit pattern relative to the unencoded data or bit pattern. The techniques described herein can be applied to any suitable type of I/O communications, including Unified I/O implementations.

Figure 5:
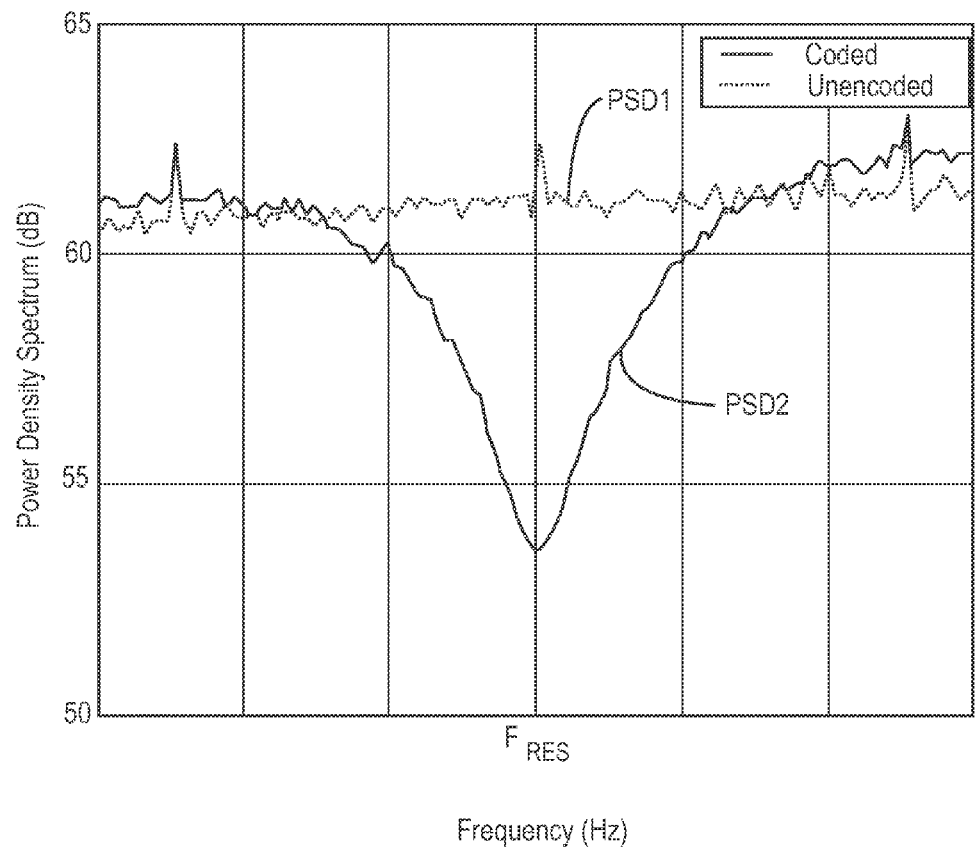
FIG. 5 is a plot of the power spectral density magnitude of an exemplary unencoded data or bit pattern and an exemplary encoded data or bit pattern plotted against frequency.

FIG. 5 illustrates the PSD of a problematic or unencoded data or bit pattern plotted against an encoded or substitute data or bit pattern. More particularly, the PSD of an exemplary problematic or unencoded data or bit pattern is shown as plot PSD1 and the PSD of an exemplary encoded or substitute data or bit pattern is shown as plot PSD2. As shown in FIG. 5, the PSD characteristic of the encoded or substitute data pattern PSD2 sharply decreases in a frequency band encompassing, in embodiments above and below, $f_{RES}$, and therefore the encoded or substitute data or bit pattern has significantly reduced energy relative to the unencoded or problematic data or bit pattern in that frequency band. Thus, the degree of coupling between PDN 104 and SDN 106, and therefore the level of induced noise on PDN 104, is significantly reduced by the encoded or substitute data or bit pattern relative to the unencoded data or bit pattern.

Figure 6:
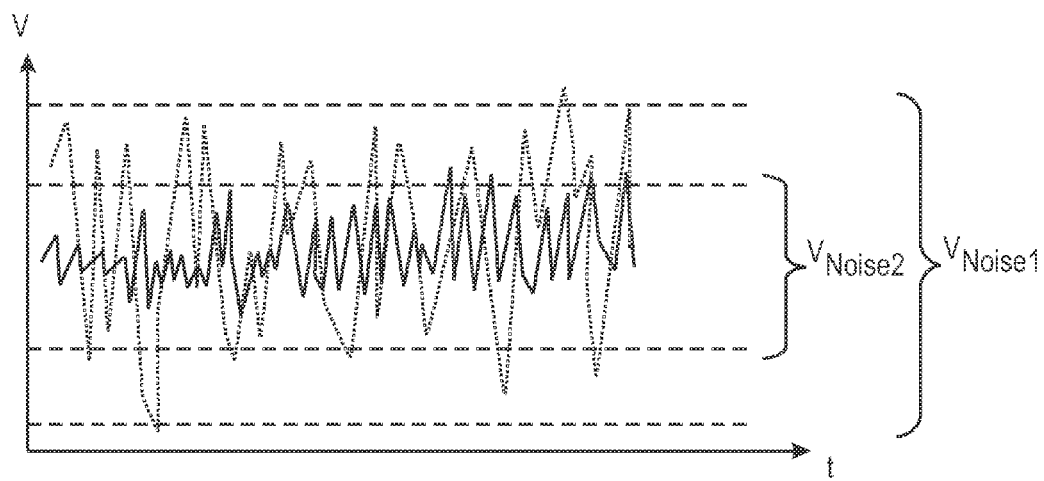
FIG. 6 is a plot of the induced noise levels produced by a exemplary unencoded and encoded data or bit patterns in an exemplary power distribution network of a printed circuit board.

FIG. 6 illustrates the beneficial effect that may be obtained by substituting an encoded data or bit pattern signal having a PSD characteristic with reduced energy at or near $f_{RES}$. Waveform VNOISE1 represents the noise level induced within PDN 104 by an unencoded or problematic data or bit pattern. Waveform VNOISE2 represents the reduced level of noise that is induced within PDN 104 by an encoded or substitute data or bit pattern. Waveform VNOISE2 of the encoded data or bit pattern has a significantly reduced peak-to-peak voltage swing relative to waveform VNOISE1 of the unencoded or problematic data or bit pattern In embodiments, elements 124 and 134 may alter the bit or data pattern of a problematic signal by various methods, including altering the data bit pattern of the data signal to be placed on SDN 106. More particularly, each data or bit pattern will have a corresponding PSD characteristic. The problematic data or bit patterns having PSD characteristics that exceed a given amplitude threshold at frequencies at or near the resonant frequency $f_{RES}$ and, in embodiments, at other frequencies where the impedance of PDN 104 exceeds a predetermined threshold, may be altered by elements 124 and 134 into substitute data or bit patterns having reduced or minimal energy at $f_{RES}$ and, in embodiments, at the other frequencies at which the impedance of PDN 104 exceeds a maximum threshold. The altered data or bit patterns are then placed by elements 124 and 134 as substitute or encoded data or bit pattern signals onto SDN 106, thereby reducing the degree of coupling between PDN 104 and SDN 106 relative to the coupling that would have occurred had the original data or bit pattern signal been issued onto SDN 106.

Figure 7:
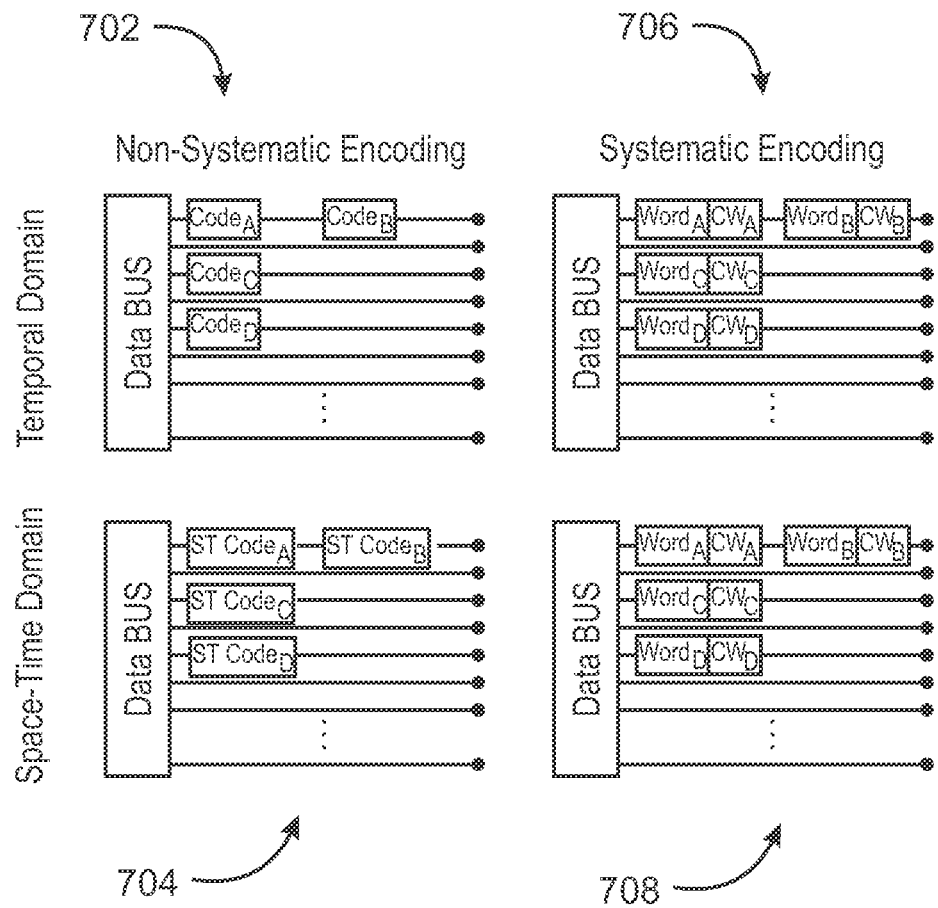
FIG. 7 illustrates exemplary encoding methods of the present invention.

FIG. 7 illustrates exemplary configurations for encoding data or bit patterns on a data bus or portion of SDN 104. More particularly, FIG. 7 illustrates four exemplary encoding schemes, i.e., encoding schemes 702, 704, 706 and 708. Encoding scheme 702 issues encoded bit or data patterns $Code_A$ on a first data channel, $Code_C$ on a second data channel, and $Code_E$ on a third data channel, and continues to encode the data or bit patterns issued on the first data channel as illustrated by $Code_N$. Thus, encoding scheme 702 is a non-systematic encoding scheme, wherein the encoded bit or data patterns are derived at least in part from the data to be encoded, that occurs in the time domain.

Encoding scheme 704 issues encoded bit or data patterns $STCode_A$ on a first pair of data channels, $STCode_B$ on a second pair of data channels, and $STCODE_C$ on a third pair of data channels, and continues to encode the data or bit patterns issued on the first pair of data channels as shown by $STCode_N$. Thus, encoding scheme 704 is a non-systematic encoding scheme, wherein the encoded bit or data patterns are derived at least in part from the data to be encoded, that occurs in the space-time domain.

Encoding schemes 706 and 708 issue encoded bit or data patterns, each of which include a data word and one or more associated code bits referred to as a code word (CW). More particularly, encoding scheme 706 issues the encoded bit or data patterns $Word_A$ and code word $CW_A$ on a first data channel, $Word_C$ plus code word $CW_C$ on a second data channel, and $WORD_E$ plus code word $CW_E$ on a third data channel, and continues to encode the data or bit patterns issued on the first data channel as illustrated by $Word_N$ plus code word $CW_N$ on the first data channel. Thus, encoding scheme 706 is a systematic encoding scheme that occurs in the time domain.

Encoding scheme 708 issues encoded bit or data patterns $Word_A$ plus code word $CW_A$ on a first pair of data channels, $Word_C$ plus code word $CW_C$ on a second pair of data channels, and $WORD_E$ and code word $CW_E$ on a third pair of data channels, and continues to encode the data or bit patterns issued on the first pair of data channels as illustrated by $Word_N$ plus code word $CW_N$ on the first pair of data channels. Thus, encoding scheme 708 is a systematic encoding scheme, wherein the code words for each data channel are derived at least in part from the data in the pair of lanes to be encoded, that occurs in the space-time domain.

It should be particularly noted in regard to encoding schemes 704 and 708 that encoding can occur across or span a group of two or more lanes, and is not limited to encoding or spanning only a pair of two lanes.

Figure 8:
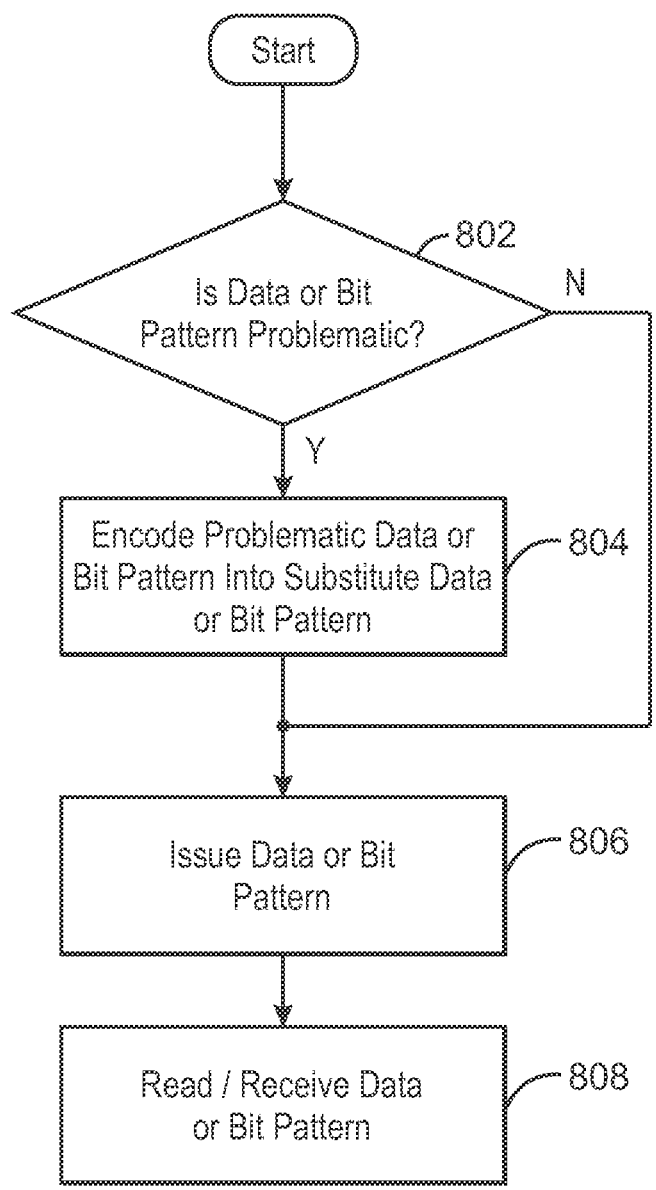
FIG. 8 is a process flow diagram of one embodiment of a method for mitigating resonant effects in a power distribution network of a printed circuit board, in accordance with the present invention.

FIG. 8 is a process flow diagram of a method 800 for reducing the noise signal induced onto a PDN by signals carried by a SDN. In various embodiments, method 800 may be performed by, for example, an electronic device such as electronic device 100 of FIG. 1. The method 800 may be embodied by or included in the firmware, operating system, or other operating instructions stored in or provided to such an electronic device, and may be, for example, embodied as machine-readable instructions stored in the memory of the electronic device, such as instructions 150 stored in memory 142 of electronic device 100 of FIG. 1. In embodiments, ICs 110 and 112, and/or Elements 122, 124, 132 and 134, may be configured with the capability to execute the method 800, such as, for example, be capable of excecuting the machine-readable instructions that embody the method 800 or be configured with logic circuitry capable of executing the method 800.

Method 800 includes the processes of determining whether a given data or bit pattern may be problematic at block 802, encoding a problematic data or bit pattern at block 804, issuing a data or bit pattern at block 806, and decoding the data or bit pattern at block 808.

More particularly, at block 802 a determination is made as to whether a given data or bit pattern may be problematic. This determination at block 802 may include predicting or estimating the PSD of the given bit pattern using a fourier transform of the current or voltage characteristic of the data or bit pattern. The estimated PSD characteristic is analyzed to determine whether the data or bit pattern signal contains a level of energy that exceeds a predetermined threshold at or near the resonant frequency of the PDN. In embodiments, the determination at block 802 may also include predicting or estimating the phase angle of the given data or bit pattern to determine whether that phase angle exceeds a predetermined threshold at or near the frequency at which the PDN impedance characteristic exceeds a predetermined phase angle threshold or has a maximum phase angle.

If the level of energy, and in embodiments the phase angle, of the data or bit pattern does not exceed the predetermined threshold at or near the PDN resonant frequency, then the data or bit pattern is classified as not problematic, and the data or bit pattern is issued onto the SDN at block 806. Conversely, if the level of energy, and in embodiments the phase angle, of the data or bit pattern signal exceeds the predetermined threshold at or near the PDN resonant frequency, then the data or bit pattern is classified as potentially problematic. In that case, method 800 at block 804 encodes the problematic data or bit pattern. Encoding the problematic data or bit pattern may, in embodiments, include the use of a look up table as described herein above. The encoded data or bit pattern is then issued at block 806. The issued data or bit pattern is then read from or otherwise received via the SDN at block 808. If the issued data or bit pattern was not encoded it is simply read or received. If the issued data or bit pattern was encoded, then the data or bit pattern is decoded at block 808, such as, for example, by utilization of a look up table as discussed above herein.

Example 1

An electronic device is provided herein that includes a power delivery network (PDN) and a signal distribution network (SDN). The device further includes elements that reduce the amount of energy that is induced into the PDN by signals carried by the SDN, and thereby reduces the degree of coupling between the PDN and SDN. The elements alter or encode problematic data or bit patterns, i.e., data or bit patterns that contain power levels and/or phase angles that exceed predetermined thresholds and thus may induce relatively high levels of noise onto the PDN, and issues onto the SDN the substitute or encoded data or bit patterns in place of the problematic data or bit patterns.

Example 2

A method is provided herein to reduce the degree of coupling between a power delivery network (PDN) and a signal distribution network (PDN), thereby reducing noise on the PDN induced by signals carried by the SDN. The method includes determining whether a given data or bit pattern is problematic and, if so, encoding or altering the problematic data or bit pattern into a substitute data or bit pattern that is not problematic. The substitute, or original if not problematic, data or bit pattern is issued onto the SDN, and decoded, if necessary, upon read or receipt.

Example 3

At least one machine-readable medium is provided herein. The medium includes instructions stored therein that, in response to being executed on an electronic device, cause the electronic device to determine whether a given data or bit pattern to be placed on a signal distribution network (SDN) of a printed circuit board may have at least one of a power spectral density and a phase angle that exceed predetermined thresholds at or near a resonant frequency of a power delivery network of a printed circuit board, and which may induce noise within a signal distribution network of that printed circuit board, and may therefore be a problematic data or bit pattern. If the data bit or pattern may be problematic, the instructions encode or alter the problematic data or bit pattern into a substitute data or bit pattern that is not problematic. The substitute, or original if not problematic, data or bit pattern is issued onto the SDN, and decoded, if necessary, by the instructions upon read or receipt.

It is to be understood that specifics in the aforementioned examples may be used anywhere in one or more embodiments. For instance, all optional features of exemplary devices described above may also be implemented with respect to any of the other exemplary devices and/or the method described herein. Furthermore, although flow diagrams and/or state diagrams may have been used herein to describe embodiments, the present techniques are not limited to those diagrams or to their corresponding descriptions. For example, the illustrated flow need not move through each box or state or in exactly the same order as depicted and described.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the techniques.

What is claimed is:

1. An electronic device, comprising:
   a circuit board;
   a power distribution network disposed on the circuit board and having an impedance characteristic that varies with frequency;
   a signal distribution network disposed on the circuit board;
   an integrated circuit to receive operating power from the power distribution network and place a data signal onto the signal distribution network; and
   at least one element coupled to or included in the integrated circuit, the element to determine whether the data signal is a problematic data signal based on whether a phase angle or a power spectral density of the data signal exceeds a specified threshold at a given frequency, alter the data signal to a substitute data signal if the data signal is determined to be problematic, and cause the substitute data signal to be issued onto the signal distribution network instead of the problematic data signal.

2. The electronic device of claim 1, wherein the given frequency is at or near a resonant frequency of the power distribution network.

3. The electronic device of claim 1, wherein the element encodes the problematic data signal into the substitute data signal.

4. The electronic device of claim 3, wherein the element encodes the problematic signal into a substitute data signal using non-systematic encoding.

5. The electronic device of claim 3, wherein the element encodes the problematic data signal in at least one of a time domain and a space domain.

6. The electronic device of claim 3, wherein the element comprises a first and second element, the first element encoding the problematic data signal into the substitute data signal, the second element configured for decoding substitute data signals.

7. A method for reducing noise on a power distribution network of a circuit board, comprising:
   determining whether a data signal is problematic based on whether a phase angle or a power spectral density of the data signal exceeds a specified threshold at a given frequency;
   issuing the data signal onto a signal distribution network of the circuit board if the data signal is determined to not be problematic; and
   encoding the data signal to generate an encoded data signal if the data signal is determined to be problematic, and issuing the encoded data signal onto the signal distribution network.

8. The method of claim 4, wherein the given frequency comprises a frequency at or near a resonant frequency of the power distribution network.

9. The method of claim 7, wherein encoding the data signal comprises non-systematic encoding.

10. The method of claim 7, wherein the element encodes the signal in at least one of a time domain and a space domain.

11. The method of claim 7, wherein determining whether the data signal is problematic comprises finding the data signal in a look up table.

12. The method of claim 11, wherein encoding the data signal comprises retrieving the encoded data signal from the look up table.

13. The method of claim 7, further comprising decoding the encoded data signal when the encoded data signal is read or otherwise received from the signal distribution network.

14. The method of claim 13, wherein decoding the encoded signal comprises finding the encoded signal in a look up table and reading a decoded signal from the look up table.

15. At least one non-transitory machine-readable medium having instructions stored therein that, in response to being executed on an electronic device, cause the electronic device to:
   identify a data signal as a problematic data signal by comparing at a given frequency at least one of a phase angle and a power spectral density of the data signal to at least one of a magnitude and a phase angle of an impedance characteristic of a circuit board power distribution network within the electronic device;
   encode the problematic data signal into an encoded data signal; and
   issue the encoded data signal onto a signal distribution network of an integrated circuit.

16. The machine-readable medium of claim 15, wherein identifying further comprises listing data signals identified as problematic data signals in a look up table.

17. The machine-readable medium of claim 16, wherein encoding comprises storing the encoded data signal in an entry of the look up table that corresponds to the problematic data signal.

18. The machine-readable medium of claim 15, further comprising reading or otherwise receiving the encoded data signal from the signal distribution network and decoding the encoded data signal.

19. The machine-readable medium of claim 18, wherein decoding comprises retrieving a decoded signal from an entry in a look up table that corresponds to the encoded data signal.

* * * * *